US006864116B1

(12) United States Patent
Kim et al.

(10) Patent No.: US 6,864,116 B1
(45) Date of Patent: Mar. 8, 2005

(54) ELECTRONIC PACKAGE OF PHOTO-SENSING SEMICONDUCTOR DEVICES, AND THE FABRICATION AND ASSEMBLY THEREOF

(75) Inventors: Deok Hoon Kim, Tempe, AZ (US); John J. H. Reche, Tempe, AZ (US)

(73) Assignee: OptoPac, Inc., Seoul (KR)

( * ) Notice: Subject to any disclaimer, the term of this patent is extended or adjusted under 35 U.S.C. 154(b) by 0 days.

(21) Appl. No.: 10/692,816

(22) Filed: Oct. 27, 2003

Related U.S. Application Data
(60) Provisional application No. 60/507,100, filed on Oct. 1, 2003.

(51) Int. Cl.[7] .................. H01L 21/00; H01L 21/30; H01L 21/46
(52) U.S. Cl. ........................... 438/65; 438/458
(58) Field of Search ............ 438/64–65, 458–460

(56) References Cited

U.S. PATENT DOCUMENTS

| | | | |
|---|---|---|---|
| 3,292,240 A | 12/1966 | McNutt et al. | |
| 5,302,778 A | 4/1994 | Maurinus | |
| 5,583,076 A | * 12/1996 | Yoshizawa et al. | ........... 438/64 |
| 5,716,759 A | 2/1998 | Badehi | |
| 6,040,235 A | 3/2000 | Badejo | |
| 6,117,707 A | 9/2000 | Badehi | |
| 6,441,478 B2 | 8/2002 | Park | |
| 6,743,696 B2 | * 6/2004 | Jeung et al. | ................ 438/458 |
| 2001/0030276 A1 | 10/2001 | Hoshino | |

OTHER PUBLICATIONS

Zdenek Knittl, Optics of Thin Films (an Optical Multilayer Theory), John Wiley & Sons, Ltd., Prerov. Czechoslovakia, pp. 11–21; 364–365 (1976).

James D. Rancourt, Optical Thin Films, Users' Handbook, Macmillan Publishing Company, New York, New York, pp. v–xi; 210–213 (1987).
H. A. Macleod, Thin–Film Optical Filters, American Elsevier Publishing Company, Inc., New York, New York, pp. ix–x; 37–42, 56–57 (1969).
O. S. Heavens, Optical Properties of Thin Solid Films, Dover Publications, Inc., New York, New York, pp. v–vii; 46–63 (1965).

* cited by examiner

*Primary Examiner*—Cuong Nguyen
(74) *Attorney, Agent, or Firm*—Rosenberg, Klein & Lee (57) ABSTRACT

A photo-sensing device package and the method of packaging such device is provided. The package includes an assembly portion having a substrate formed of a material substantially transparent to light within a predetermined range of wavelengths; a sensing portion including at least one photo-sensing die photo-electronically transducing light within the predetermined range of wavelengths; and, a plurality of first solder joints joining the sensing and assembly portions. The assembly portion is formed with at least a first metal layer disposed on the substrate about a front surface region thereof; and, at least one passivation layer formed to extend over the first metal layer. The passivation layer is patterned to define a plurality of first and second access openings which respectively describe on the first metal layer a plurality of first and second solder bump pads, each of which is interconnected to at least one of the second solder bump pads. The sensing portion's photo-sensing die is positioned with its photo-sensing area opposing the front surface region of the assembly portion's substrate, and has formed thereon a plurality of solder bump pads electrically coupled to the photo-sensing area. Each of the first solder joints extends between one of the sensing portion's solder bump pads and one of the assembly portion's first solder bump pads.

16 Claims, 8 Drawing Sheets

ELECTRONIC PACKAGE OF PHOTO-SENSING SEMICONDUCTOR DEVICES, AND THE FABRICATION AND ASSEMBLY THEREOF

This application claims benefit of 60/507,100 filed Oct. 1, 2003.

PRIOR ART

Figure 1:
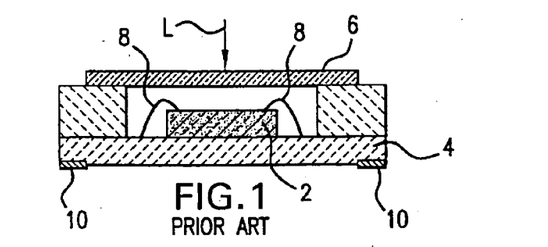
FIG. 1 is a schematic cross-sectional view of a prior art CLCC package for a photo-sensor device.

Photo-sensing semiconductor devices have been typically mounted in ceramic packages. FIG. 1 shows a schematic cross-section view of a ceramic leadless chip carrier (CLCC), which is the most popular package format for photosensing devices. As shown in the figure, a photo sensing semiconductor die is mounted face-up on a ceramic substrate 4 by using epoxy or the like inside of an enclosure that is covered by a glass lid 6. Wire bonding 8 is typically used to connect the photo-sensing die 2 to the ceramic substrate 4. Solderable pads 10 are provided on the bottom of ceramic substrate 4 to connect the package to a circuit board.

Perhaps the most critical drawback of this package is that it is very expensive. Another drawback is that the package size is not small enough for some hand-held applications such as cameras in cellular phones where small size and light weight are essential features. Another drawback is that the package's configuration does not allow very precise placement of the photo-sensing device in relation, for instance, to the focal plane of a lens because, among other things, the photo-sensing die is mounted with epoxy or the like, and the package itself is mounted with solder paste.

U.S. Pat. No. 5,302,778, entitled "Semiconductor Insulation for Optical Devices," teaches the mounting of a photo-sensor on a printed-circuit board by integrating a sensor, a lens, and a molded mount in a molded mount package providing locating pins. The aforementioned Patent provides limited improvements in positioning accuracy for the sensor with respect to its primitive lens system. It also provides at best mediocre accuracy in the placement of the package itself on a mounting board.

Figure 2:
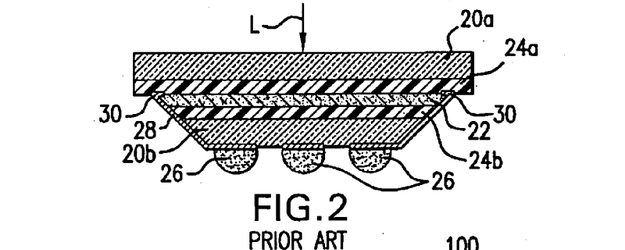
FIG. 2 is a schematic cross-sectional view of another prior art photosensing package.

Another known packaging approach for photo-sensing semiconductor devices is one offered by Shellcase, Inc. Detailed techniques are disclosed by U.S. Pat. Nos. 5,716,759, 6,040,235, and 6,117,707. FIG. 2 shows a schematic cross-section of a package formed in accordance with those techniques. A patterned metal layer is applied to a photo-sensing semiconductor wafer to extend bonding pads to its dicing area having a narrow width between neighboring dice. A photo-sensing wafer is attached to a glass substrate by using epoxy. After that, the backside of the wafer is ground for to thin out the wafer. The silicon of the dicing area is then removed to expose metal lines. Many more process steps are needed to complete fabrication, but a detailed explanation is omitted, as such is not necessary for a clear understanding in the present invention.

The advantage of this package compared to a CLCC package is its smaller size. A number of drawbacks are nonetheless found in this package as well. Perhaps the most critical drawback with this package is the complexity both in structure and fabrication process. This complexity is a significant factor in mass production since complexity tends to increase the processing yield loss. As a result of its complexity and attendant yield loss, the package is expensive to fabricate.

Other nontrivial disadvantages of this technique include its need for a wide dicing line, which cuts against the trend in semiconductor manufacturing to decrease the width of dicing lines to achieve more dice per wafer. The current typical dicing line width of about 100 micrometers is not wide enough to support this technique. Consequently, the packaging technique is not compatible with semiconductor wafers having standard dicing line widths, and requires customizing measures to ensure the wider than usual dicing line widths.

Accordingly, it is an object of the present invention to provide a lower cost package for photo-sensing devices. Another object of the present invention is to provide a sufficiently compact package for photo-sensing devices to accommodate hand-held applications like cellular phone cameras where the small size is possibly the single most important packaging factor. Yet another object of the present invention is to provide a simple and conveniently fabricated and assembled package in which precise positioning of a focal plane in the horizontal as well as the vertical plane is effected in an effortless manner.

SUMMARY OF THE INVENTION

Briefly described, and in accordance with a preferred embodiment thereof, the present invention relates to a structure of an electronic package of photosensing semiconductor devices and the method of fabrication and assembly thereof.

In accordance with the present invention, a plurality of solder bumps are provided on a photo-sensing semiconductor wafer via "wafer bumping" or any other suitable technique known in the art. After that, the bumped wafer is diced to separate into individual dice which form the sensing portions.

A substrate is fabricated separately. This substrate may be configured, for example, as a circular wafer or a rectangular panel. This substrate will have a plurality of unit substrates in much the same manner as the semiconductor wafer having a plurality of dice. Each unit substrate becomes an assembly portion which, together with the sensing portion, forms the electronic package after fabrication and assembly are complete. The material for the substrate is preferably transparent at the wavelength of light where the photo-sensing devices respond. Borosilicate glass is one example of a material having sufficient transparency for photo-sensing devices in the visible portion of the spectrum. The fabrication of this substrate includes forming at least one patterned metal layer to make solder bump pads and interconnection lines between the solder bump pads by deposition and patterning using any suitable measures known to persons versed in semiconductor fabrication art. These solder bump pads are grouped into at least two sets. The solder bump pads in the first set are relatively smaller and correspond to the solder bumps of the photo-sensing dice for making interconnections to those photo sensing dice. The solder bump pads in the second set are relatively larger and are used for making interconnections of the resulting package itself to external circuits, such as supporting printed circuit board. Also, the substrate includes at least one patterned passivation layer over the patterned metal layer for protecting the interconnection lines formed thereby. This patterned passivation layer has openings at the solder bump pads. Preferably, the substrate also includes a patterned dust-seal layer over the patterned passivation layer around the photo-sensing area for preventing dust particles from entering the area.

Solder bumps are mounted on the second set of solder bump pads for connection of the resulting package to an external circuit. Preformed solder spheres can be used for this solder bumping process in much the same manner as they are, for example, in BGA or CSP solder ball mounting. This process generally includes flux application onto the solder bump pads, solder sphere placement onto the fluxed solder bump pads, and heating the substrate up to a characteristic reflow temperature of the solder to cause the solder spheres to melt and wet down onto the solder bump pads.

The bumped and diced photo-sensing dice are then mounted onto the substrate using, preferably, a suitable flipchip mounting technique known to persons versed in semiconductor manufacturing art. The process includes serial pick-and-flip-and-place of each photo-sensing dice onto a predetermined location of the substrate until each unit substrate has all the necessary photo-sensing dice placed thereon as designed. This pick-and-flip-and-place process typically includes flux application onto the soldering area, after which the substrate is heated to a characteristic reflow temperature of the solder bumps for making interconnections between the unit substrate and the photo-sensing dice.

Dicing of the large substrate follows thereafter to separate each unit substrate. Each substrate unit may then be picked-and-placed into a preferred packing media such as tray, tube, or tape and reel.

While a CLCC package requires a ceramic substrate for interconnection and a glass lid for light transmission, a package formed in accordance with the present invention requires only a glass substrate having both functions. Also, the present invention employs batch processes such as wafer bumping for photo-sensing device wafer. It similarly employs batch processes for the fabrication and assembly of the substrate having a plurality of unit substrates. As a result of this simplification and batch processing, the present invention decreases packaging costs significantly. Unlike certain packaging techniques heretofore known, for instance, the present invention uses flipchip mounting which is a simple and field proven technique instead of very complicated processes that require extending bonding pads onto dicing areas, thinning of the wafer, and removing of silicon to expose the metal on dicing areas. Also, such features as flipchip mounting of photo-sensing dice onto a substrate and the use and arrangement of solder bumps for the disclosed package provide consistent and precise, guided positioning of a focal plane in the horizontal and vertical directions in an effortless manner. Self-alignment effectively occurs during the solder reflow process.

DETAILED DESCRIPTION OF THE PREFERRED EMBODIMENTS

A photo-sensing semiconductor wafer has a plurality of dice, and each die has integrated circuitry formed on a front surface of the wafer, much as in other semiconductor wafers. Each die has a plurality of bonding pads. The wafer has a patterned passivation layer over the front surface for protecting the integrated circuitry underneath. The passivation layer has openings on said bonding pads. Each such photo-sensing die has at least one photo-sensing area on a front surface.

Wafer bumping is a well-known technique that has been widely used since its initial teaching, as reflected in U.S. Pat. No. 3,292,240 entitled "Method of Fabricating Microminiature Functional Components," assigned to IBM. A typical wafer bumping process includes at least one patterned metal layer for making solder bump pads connected to bonding pads on the wafer. Metallurgy used for solder bump pads is commonly referred to as under bump metallurgy (UBM) and typically utilizes a multilayered structure to provide multiple functions, such as good adhesion to bonding pad, good diffusion barrier against solder, and good wettability to solder (and oxidation protection if necessary). Various techniques for depositing UBM are available, including sputtering, electroplating, electroless plating, and the like.

A predetermined amount of solder material is applied onto the solder bump pads. There are numerous ways to apply solder—electroplating, solder paste printing, etc. There are several solder materials often used in wafer bumping—eutectic tin-lead, high lead (tin-lead solder having more than 80% of lead in weight scale), and lead-free (typically tin based solder such as pure tin, tin-silver, tin-copper, tin-silver-copper, etc).

The wafer bumping process also includes heating the wafer to a characteristic reflow temperature of the solder for causing connection of solder to the solder bump pads. Wafer bumping could optionally include at least one patterned passivation layer under the patterned metal layer, which is so-called "re-passivation." Also, wafer bumping could optionally include interconnection metal traces between the bonding pads and the solder bump pads, which is so-called "redistribution." This redistribution typically necessitates another patterned passivation layer for protecting the interconnection metal traces. Such various structures for wafer bumping are well known to persons versed in wafer bumping art.

Figure 3A:
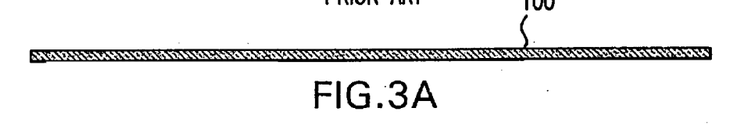
FIG. 3A is schematic cross-sectional view of an undiced photo-sensing semiconductor wafer in one exemplary embodiment of the present invention, before processing.
Figure 3B:
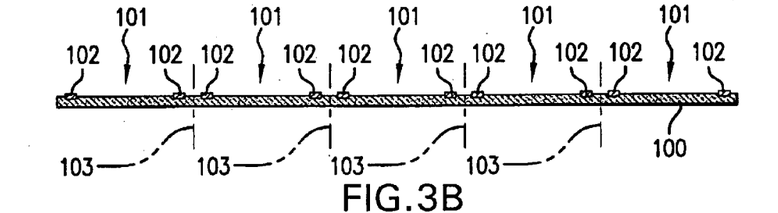
FIG. 3B is schematic cross-sectional view of an undiced photo-sensing semiconductor wafer in one exemplary embodiment of the present invention, after a patterned metal layer is applied.
Figure 3C:
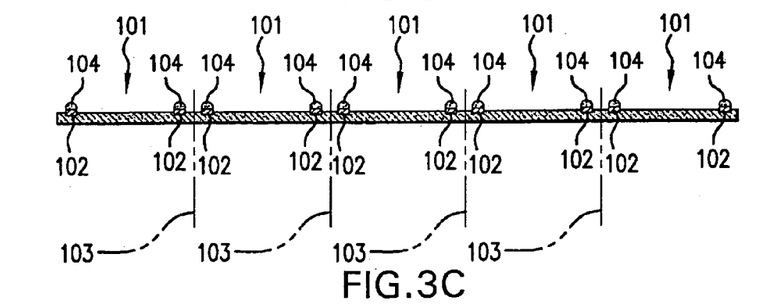
FIG. 3C is schematic cross-sectional view of an undiced photo-sensing semiconductor wafer in one exemplary embodiment of the present invention, after solder bumping.

In accordance with the present invention, a bumped wafer is preferably used for making an electronic package for photo-sensing devices, but is not limited to any specific structure, bumping technique, or solder material used in such wafer bumping. In a preferred embodiment, the solder bump height of the photo-sensing wafer after wafer bumping is preferably less than 100 micrometers. FIGS. 3A–3C respectively illustrate schematic cross-sections of a photo-sensing semiconductor wafer 100 before processing, after applying a patterned metal layer to form a plurality of solder bump pads 102, and after solder bumping to form a plurality of solder bumps 104.

Before, during, or after wafer bumping, the wafer 100 is thinned out to a certain thickness, if necessary, by mechanical grinding using any suitable means known in the art of semiconductor manufacturing. The object of this thinning process will be explained later in this section. Preferably, the thickness of the wafer 100 after thinning is approximately 250–350 micrometers, and where sufficient resources are available, approximately 150–350 micrometers. The photo-sensing wafer is thereafter diced to separate each die 101 along dicing lines 103, again using any suitable means known in the art of semiconductor manufacturing.

A substrate is fabricated separately. This substrate is preferably in wafer or panel form having a large area sufficient to form a plurality of unit substrates in a batch process in a manner similar to that of a semiconductor wafer being made to have a plurality of dice. In general, the primary requirements for the substrate material include: transparency, mechanical rigidity, and chemical stability. The substrate material is selected to be one which is transparent to a certain wavelength or range of wavelengths, so as to transmit such light onto the photo-sensing device. Suitable substrate materials include, but are not limited to, glass, quartz, sapphire, silicon or other such infrared transparent materials. The choice of the substrate material depends on the range of wavelengths of interest, such that photo sensing devices operating at wavelengths in any of the ultraviolet, visible, or infrared spectra, for instance, may benefit from the present invention. Chemical resistance and mechanical stability are required to endure the temperature and various processing steps during fabrication, as well as to resist the environment during the resulting devices' expected life. A typical substrate material for photo-sensing devices operating in the visible range of wavelengths is borosilicate glass. It is a preferred material because its chemical and temperature stability may be obtained at reasonable cost, and because it is available from many sources.

Figure 4:
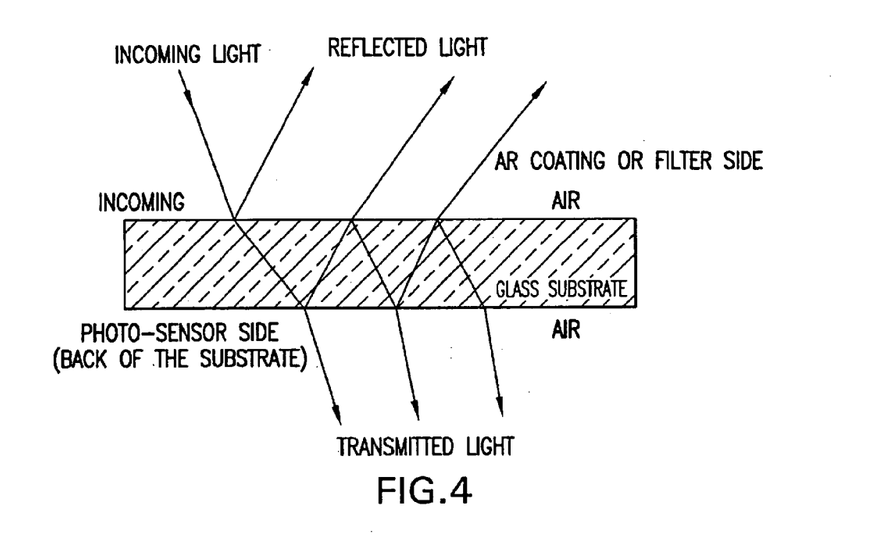
FIG. 4 is an explanatory schematic diagram illustrating the air-to-glass transmission and reflection of impinging light at transition from a low index of refraction medium to a high index of refraction medium.

The substrate may be coated with at least one thin film layer on both surfaces to enhance light transmission therethrough. For example, an antireflection coating (ARC) or other suitable coating known to persons versed in the optical art may be applied. One purpose of this coating is to minimize the reflection loss of light over the entire spectrum of light of interest. FIG. 4 illustrates the refection of light by the substrate.

Similarly, the substrate may be coated with at least one thin film layer on just one of its surfaces to enhance or reduce light transmission at a specific range of wavelengths. Such "optical filtering" may be effected using any suitable technique known in the art of optics like those documented in books such as "Optical Properties of Thin Solid Films" by O. S. Heavens published by Butterworth in 1955, "Thin-Film Optical Filters" by H. A. Macleod published by American Elsevier in 1969, "Optics of Thin Films, an Optical Multilayer Theory" by Z. Knittl published by John Wiley in 1976 or "Optical Thin Film's User's Handbook" by J. D. Rancourt published by MacMillan in 1987.

Figure 5:
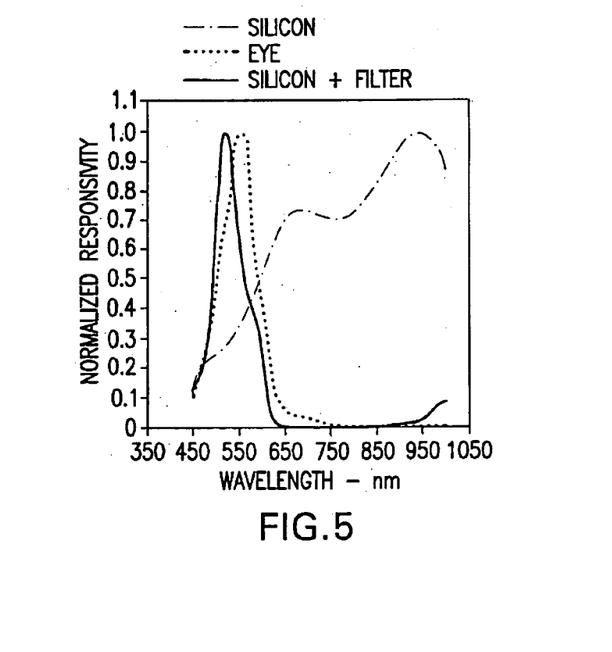
FIG. 5 is an explanatory diagram graphically illustrating an example of photo-sensing response modification due to forming an optical filter on a substrate.

FIG. 5 shows an example of a modified photo-response obtained with a filter placed at a front of the photo-sensing device. In this particular example, the filter is designed to have the photo-sensing device mimic the sensitivity of the human eye and cut-off the intrinsic response of silicon in the ultra-violet (UV) and the infrared regions. In the preferred embodiment, a large wafer or panel of borosilicate glass is used for the substrate, preferably having approximately a 400–800 micrometer thickness, and even a 250–800 micrometer thickness where the available resources permit. Also in the preferred embodiment, the substrate is coated with at least one layer of thin film on either or both its front and rear surfaces to minimize reflection loss, or to enhance or reduce light transmission in the range of wavelengths of interest.

Referring to FIGS. 6A–8, at least one patterned metal layer 202 is applied on a front surface 204 of the substrate 200 for making solder bump pads 206a, 206b and interconnection lines 208 connecting such solder bump pads 206a, 206b. Then, at least one patterned passivation layer 210 is applied on the patterned metal layer 202 for protecting the interconnection lines 208 formed thereby. The solder bump pads 206a, 206b are grouped into two sets. The solder bump pads 206a in the first set are relatively small for making interconnections to a photo-sensing semiconductor die 101. The solder bump pads 206b in the second set are relatively large for making interconnections of the resulting electronic package itself to an external circuit or device, such as a printed circuit board.

Figure 6A:
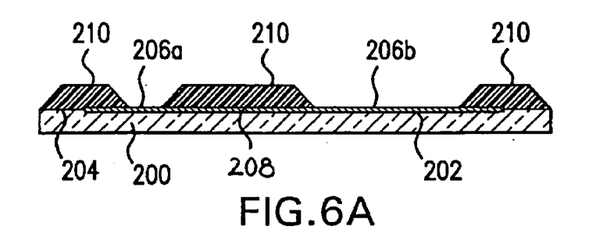
FIG. 6A is schematic cross-sectional view of a diced unit substrate at a certain stage of fabrication in one exemplary embodiment of the present invention.
Figure 6B:
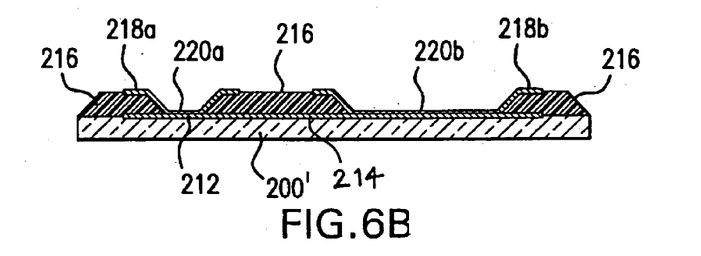
FIG. 6B is schematic cross-sectional view of a diced unit substrate at a certain stage of fabrication in an alternate exemplary embodiment of the present invention, utilizing multiple metal layers.

There are two widely used approaches to making solder bump pads and interconnection lines, and passivation. The first approach shown in FIG. 6A is to use one patterned metal layer 202 to provide both the solder bump pads 206a, 206b and interconnection lines 208, with one patterned passivation layer 210 formed over appropriate portions of the metal layer to protect the interconnecting lines 208. The second approach shown in FIG. 6B is to apply one patterned metal layer 212 to form interconnection lines 214, with one patterned passivation layer 216 for protecting the interconnecting metal line portions 214, then apply another patterned metal layer having portions 218a, 218b to form with the underlying portions of the metal layer 212 the solder bump pads 220a, 220b. In the latter case, interconnection between the first and the second metal layers 212 and 218a, 218b are made by openings in the passivation layer 216. In both options, the metal layer for solder bump pads typically has, itself, a multilayered structure including an adhesive layer for providing good adhesion to adjacent material underneath, a good diffusion barrier for solder, and a layer having good wettability for solder material (and oxidation protection if necessary), much as with the UBM used in forming solder bumping pads for the photo-sensing wafer as explained earlier.

The first option is economical because it uses only one metal layer 202; but, essentially the interconnecting metal layer includes a layer of diffusion barrier material which is not only unnecessary for interconnection metal lines but also causes high film stress. This film stress is detrimental in terms of reliability because it causes stress migration and also even delamination of the film. The second option is better in terms of reliability because it does not have the diffusion barrier layer in the interconnection metal lines; however, the option incurs increased fabrication costs by requiring multiple patterned metal layers 212 and 218a, 218b. Therefore, the choice among such options usually depends on two primary requirements, cost and reliability, which will vary depending on the intended application.

In a preferred embodiment illustrating the first option, an approximate 1–2 micrometer layer of aluminum is used as an adhesion layer, an approximately 200–500 nanometer layer of Ni—V is used as a diffusion barrier, and an approximate 500–1000 nanometer layer of copper is used as a solder wettable layer. These layers are sequentially deposited onto the substrate to collectively form the metal layer 202 at the solder burn pads 206a, 206b, preferably by sputtering without vacuum break between each layer of deposition.

In a preferred embodiment illustrated for the second option, an approximate 1–2 micrometer layer of aluminum is deposited onto the substrate for making interconnection metal lines, preferably by sputtering. The solder bump pads 220a, 220b in this second option are formed by sequentially depositing an approximate 200–2000 nanometer layer of aluminum as an adhesion layer to the interconnecting metal lines, an approximate 200–500 nanometer layer of Ni—V as a diffusion barrier, and an approximate 500–1000 nanometer layer of copper as a solder wettable layer. Each layer is deposited, preferably, by sputtering without vacuum break between layers of deposition.

In both options, a polymer layer is preferably applied as the passivation layer 210, 216. An approximate 4–20 micrometer thickness is preferred for the polymer passivation layer, which may be formed by any suitable means known to persons versed in semiconductor fabrication art.

Figure 7:
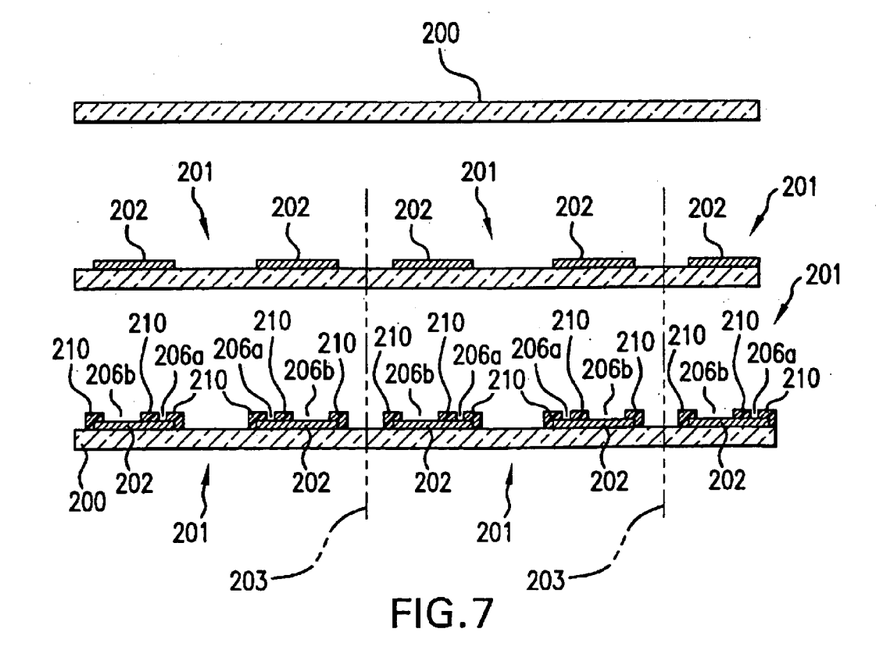
FIG. 7 is a series of schematic cross-sectional views illustrating an undiced substrate at certain stages of fabrication in one exemplary embodiment of the present invention.
Figure 8:
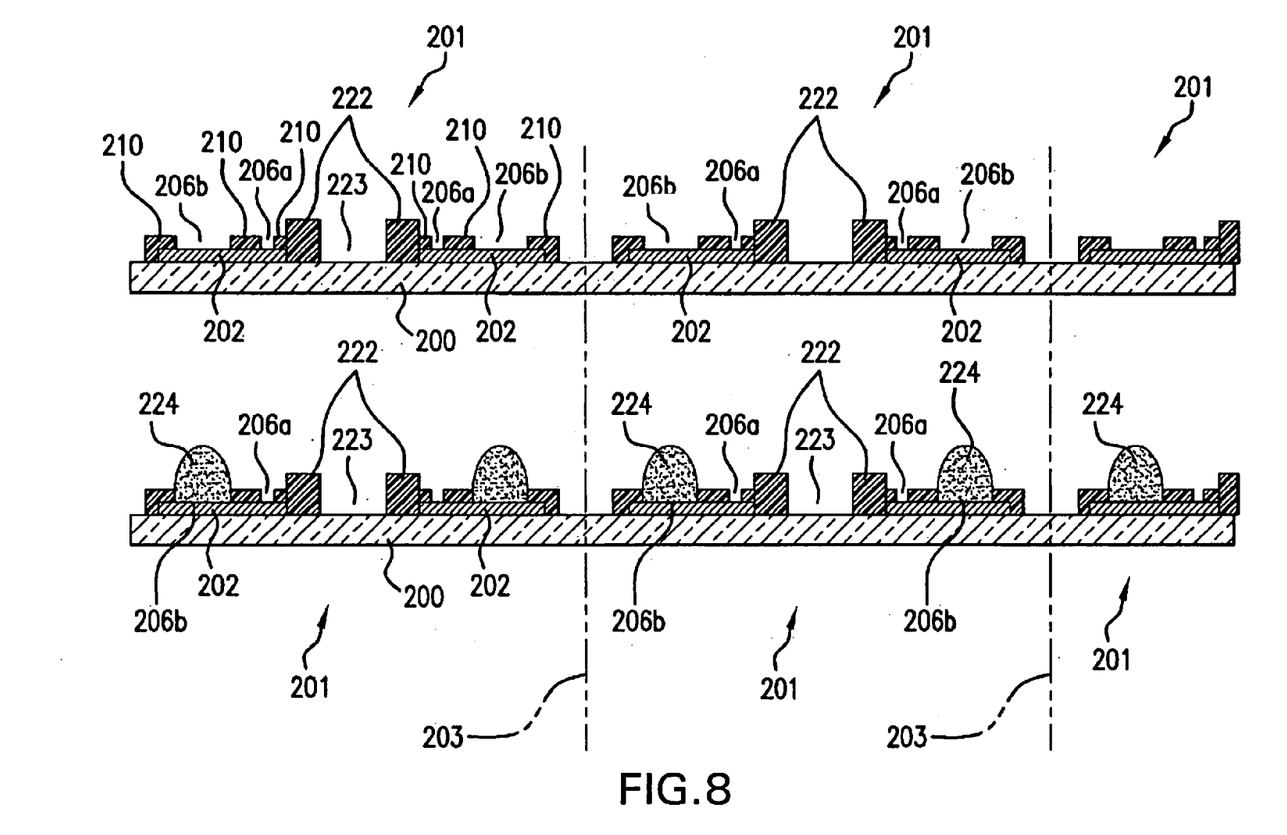
FIG. 8 is a series of schematic cross-sectional views illustrating an undiced substrate at certain further stages of fabrication in one exemplary embodiment of the present invention.

Referring to FIGS. 7–8, there are shown schematic cross sectional views of an undiced substrate 200 (in the form of a glass wafer) at different stages of fabrication. The substrate 200 is divided by dicing lines 203 into a plurality of unit substrates 201 having patterned metal 202, passivation 210, and dust-seal layers 222 formed thereon to define solder bumps 206a, 206b and a transmission region 223. As illustrated in FIG. 8, at least one patterned dust-seal layer 222 may be applied onto the substrate 200 after the metal and passivation layers 202, 210 are formed, for preventing particles of dust from reaching and obscuring the photo-sensing area. This patterned layer 222 is configured to form a dust sealing structure around the photo-sensing area at the transmission region 223 of the resulting package. Any dust obstructing light will cause errors in the light sensing. Hence, the necessity for this dust-seal layer depends on the required restriction of dust particles in the applications of interest. In the preferred embodiment illustrated, the thickness of the dust-seal layer 222 is preferably less than 80 micrometers, and a polymer material is preferred for this dust-seal layer 222.

There are several ways to create this patterned dust-seal layer 222. The most common approach is to dispense an epoxy material or the like. Another approach is to apply a blanket polymer layer and pattern it by using a photolithography process. These or any other suitable means known to persons versed in semiconductor fabrication and packaging arts may be employed in accordance with the present invention.

Next, solder bumps 224 are mounted on the second set of solder bump pads 206b formed over the substrate 200. In the preferred embodiment illustrated, solder flux is preferably applied on each appropriate solder bump pad 206b, preferably by screen printing, then preformed solder spheres 224 are placed onto each solder bump pad 206b in the second set having the solder flux applied thereon. The resulting substrate structure is heated to a characteristic reflow temperature of the solder material for melting the placed solder spheres 224 and causing them to wet down onto the solder bump pads. The solder bump 224 height is preferably, but not necessarily, more than 250 micrometers.

There are numerous solder materials that may be used in the present invention. Eutectic tin-lead solder is a common material. Lead-free solders such as pure tin, tin-silver, tin-copper, and tin-silver-copper is likely to be more widely used in the future because of generally tightening regulations to eliminate lead in the semiconductor industry. High lead solders having more than 80% of lead in weight scale is a common solder material for high temperature applications because it has higher melting temperature and less consumption of diffusion barrier in solder bump pads. The present invention is not limited to any specific solder materials.

Figure 9:
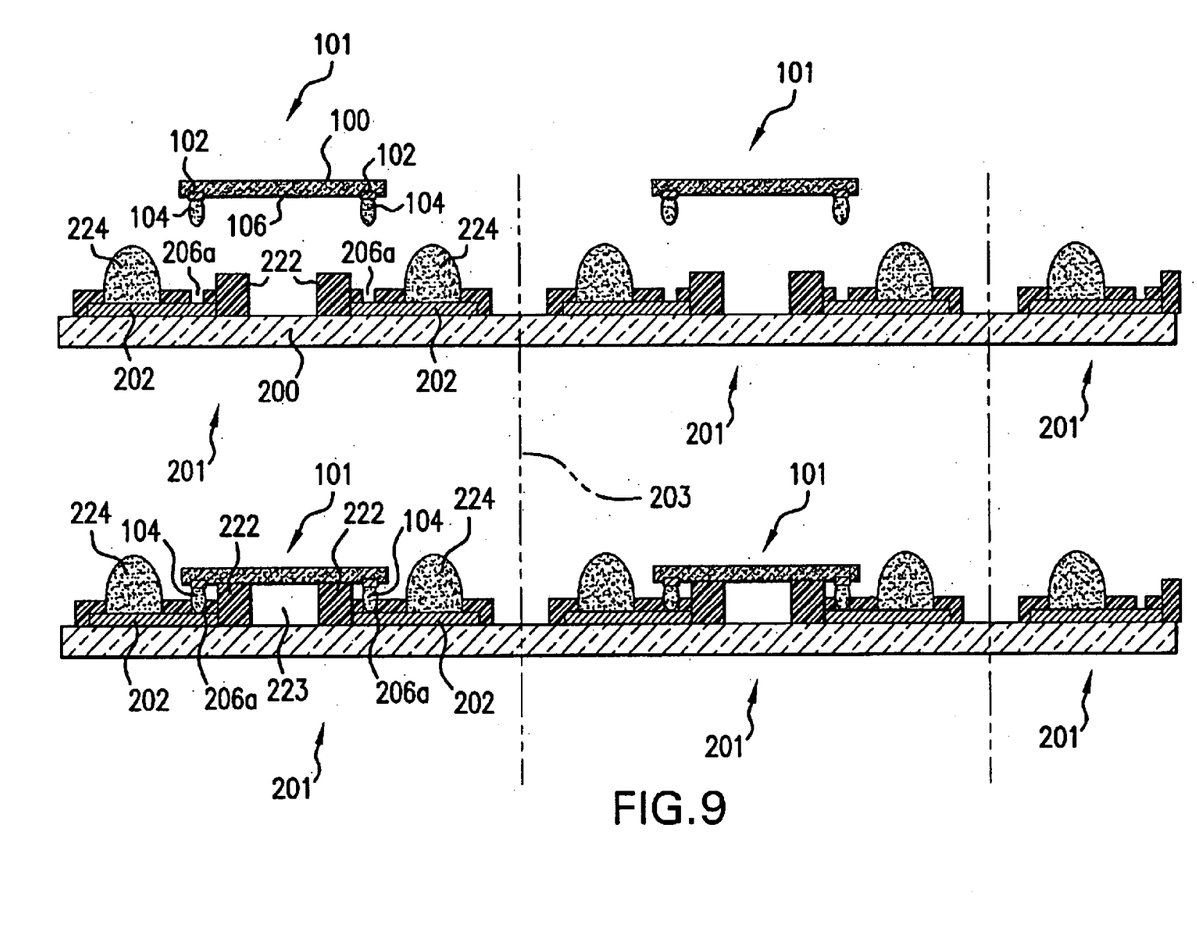
FIG. 9 is a series of schematic cross-sectional views illustrating a flipchip assembly of photo-sensing dice onto an undiced substrate in one exemplary embodiment of the present invention.

Once the substrate 200 is fabricated to form a plurality of unit substrates, or assembly portions, 201 as described above, the photo sensing dice 101 forming the sensing portions are mounted on the assembly portions 201 of the substrate 200, preferably by use of a suitable flipchip assembly process known in the art. As FIG. 9 schematically illustrates, this flipchip assembly process includes pick-and-flip-and-place of each photo sensing die 101 having solder bumps 104 onto pre-determined locations of each unit substrate 201 of the substrate 200 until all appropriate unit substrates 201 are populated with their necessary photo-sensing semiconductor dice 101. Multiple photo-sensing dice 101, of same or different kinds, may be mounted on one unit substrate 201. Other non-photo-sensing active and/or passive dice (not shown) may also be mounted on a unit substrate 201 to form a multi-chip module.

The engagement of the solder bumps 104 of each semi-conductor die 101 and the solder bump pads 206a correspondingly positioned on each unit substrate 201 ensures convenient yet consistently precise relative positioning of the photosensing die 101 and unit substrate 201. The mated engagement of preformed solder bumps and their receiving solder bump pads serves a self-guiding function as the photo-sensing die 101 is placed onto a unit substrate 201. This pick-and-flip-and-place operation includes flux application onto the solder bumps 104 of the photo-sensing dice 10, preferably by a suitable "dipping" process known in the flipchip assembly art. A rosin based water soluble flux or other suitable material may be used in this application. A so-called "no clean" flux which is organic based may also be used. The substrate is then heated to a characteristic reflow temperature of the solder material for melting the solder 112 and making solder joints 104 between the first set of solder bump pads 206a of the substrate 200 and each photo-sensing die 101. In the preferred embodiment illustrated, the height of the solder joints 104 connecting the substrate 200 and semiconductor dice 101 is preferably less than 80 micrometers.

Finally, the substrate 200 is diced along dicing lines 203 to separate the unit substrates 201. Each electronic package 300 (having at least one unit substrate structure 201) which then results is picked-and-placed onto preferred packing media such as tray, tube, or tape and reel for packing and packaging.

Figure 10:
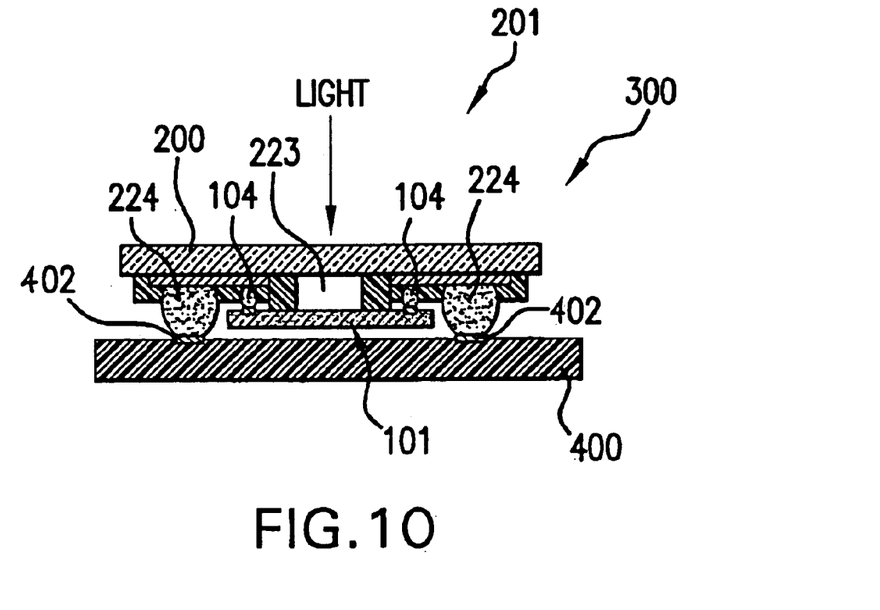
FIG. 10 is schematic cross-sectional view of an electronic package formed in accordance with an exemplary embodiment of the present invention, shown illustratively mounted onto a printed circuit board; and, FIG. 11 is a block diagram illustrating the fabrication and assembly steps for an electronic package formed in accordance with one exemplary embodiment of the present invention; and, FIG. 12 is a block diagram illustrating the fabrication and assembly steps for an electronic package formed in accordance with an alternate exemplary embodiment of the present invention.

Referring to FIG. 10, assembly of an electronic package 300 formed in accordance with the present invention onto a PCB board 400 may then be carried out by employing ball grid array (BGA) package techniques, as each unit substrate structure 201 is formed much like a typical BGA package having solder bumps 224 at peripheral portions of the package 300. This process typically includes application of solder paste onto solder bump pads 402 at the opposing PCB portions followed by a process, whereby the package 300 is inverted and mounted onto the board 400. Solder bumps 224 are thus placed onto corresponding pads 402 having solder paste applied thereon.

Figure 11:
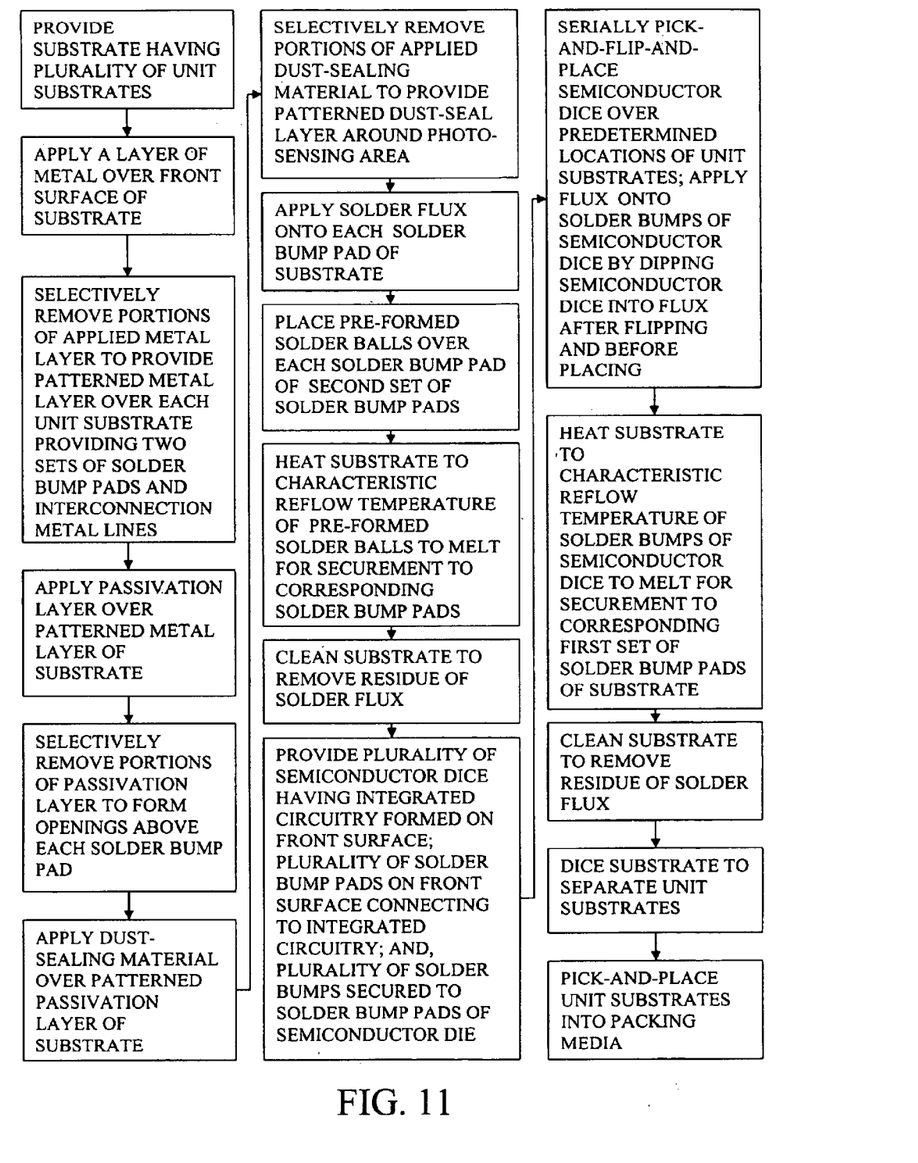
Figure 12:
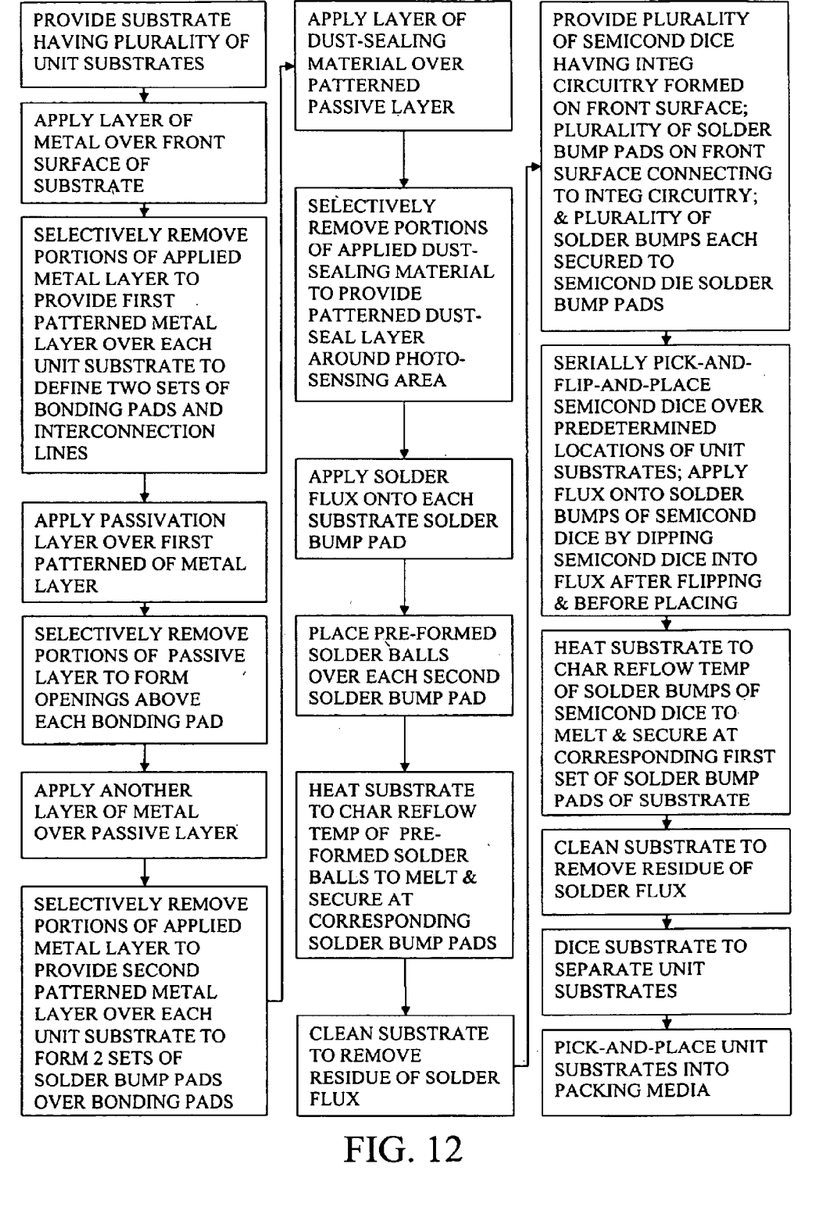

FIG. 11 illustratively shows in block diagram form the fabrication and assembly steps for the preferred embodiment of the package 300 discussed in preceding paragraphs. FIG. 12 illustratively shows in block diagram form similar fabrication and assembly steps for an exemplary alternative embodiment of the package utilizing a plurality of metal layers in forming the solder bumps of each unit substrate.

In the preferred embodiment illustrated, the height of each big solder joint formed by a solder bump 224 connecting the resulting package 300 with the PCB board 400 is preferably greater than the collective height of the small solder joint formed by a solder bump 104 (connecting a photo-sensing die 101 to a unit substrate 201) and the thickness of the photo-sensing die 101. This ensures that a gap between the photo-sensing die 101 and the PCB 400 is maintained. In the preferred embodiment illustrated, the photo-sensing semiconductor wafer 100 from which the photo-sensing dice 101 are formed is thinned down to preferably about 250–350 micrometers (150–350 micrometers where the available resources permit); the height of the small solder joints 104 connecting the photosensing die 101 and the unit substrate 201 is set to be less than approximately 80 micrometers; and, the height of big solder joints 224 connecting the resulting package 300 to the PCB 400 is set to be greater than 250 micrometers, as mentioned earlier.

This new package in the present invention is applicable to all types of photo sensors or photo detectors fabricated with various types of technologies such as CCD or CMOS. The present invention is applicable wherever area image sensors are used, such as in camcorders, digital still cameras, PC cameras, mobile phone cameras, PDA and handheld cameras, security cameras, toys, automotive, biometrics, and the like. The present invention is also applicable to linear array image sensors such as those used in fax machines, scanners, bar code readers and scanners, digital copiers, and the like. It is equally applicable in packaging non-imaging photo-sensors such as single diode or four-quadrant diodes used in motion detectors, light level sensors, positional or tracking systems, and the like.

Although this invention has been described in connection with specific forms and embodiments thereof, it will be appreciated that various modification other than those discussed above may be resorted to without departing form the spirit or scope of the invention. For example, equivalent elements may be substituted for those specifically shown or described, certain features may be used independently of other features, and in certain cases, particular combinations of fabrication or assembly steps may be reversed or interposed, all without departing from the spirit or scope of the invention as defined in the appended claims.

What is claimed is:

1. A method of packaging a photosensing device comprising the steps of:
   (a) establishing at least one photo-sensing die having at least integrated one photo-sensing area defined at a forward surface thereof for photo-electronically transducing light within a predetermined range of wavelengths;
   (b) forming on said photo-sensing die a plurality of first solder bumps electrically coupled to said photo-sensing area;
   (c) establishing at least one unit substrate formed of a material substantially transparent to light within said predetermined range of wavelengths;
   (d) forming at least one metal layer on said unit substrate about a front surface region thereof,
   (e) configuring said metal layer to define a plurality of first and second solder bump pads and a plurality of interconnection lines each extending between at least one first solder bump pad and at least one said second solder bump pad;
   (f) forming at least one passivation layer to extend over said metal layer;
   (g) configuring said passivation layer to define a plurality of first and second access openings aligned respectively with said first and second solder bump pads;
   (h) placing said photo-sensing die in inverted manner over said unit substrate, said first solder bumps each engaging one said first access opening of said passivation layer to contact one said first solder bump pad, said photo-sensing area of said photo-sensing die being thereby guided into alignment with said front surface region of said unit substrate; and,
   (i) heating said first solder bumps to a characteristic reflow temperature thereof for attachment to said first solder bump pads of said unit substrate.

2. The method of packaging a photo-sensing device as recited in claim 1 further comprising the step of attaching a plurality of second solder bumps respectively to said second solder bump pads through said second access openings.

3. The method of packaging a photo-sensing device as recited in claim 1 further comprising after step (g) the step of forming a dust-seal layer about said front surface region of said unit substrate.

4. The method of packaging a photo-sensing device as recited in claim 2 further comprising the steps of preforming said first and second solder bumps with solder ball configurations, said second solder bumps being greater in a diametric dimension than said first solder bumps.

5. The method of packaging a photo-sensing device as recited in claim 1 further comprising the step of forming an upper metal layer at least partially on said passivation layer, said upper metal layer being configured to extend at least partially over said first and second access openings to contact said first and second solder bump pads.

6. The method of packaging a photosensing device as recited in claim 1 wherein a plurality of said unit substrates are integrally defined on a substrate, said substrate being diced after step (i) for separation of said unit substrates one from the other.

7. The method of packaging a photosensing device as recited in claim 1 wherein a plurality of said photosensing dice are integrally defined on a wafer, said wafer being diced before step (h) for separation of said photo-sensing dice one from the other.

8. The method of packaging a photo-sensing device as recited in claim 7 wherein a pick-and-flip-and-place operation: is sequentially executed to place said photo-sensing dice respectively over corresponding ones of said unit substrates.

9. A method of packaging a photosensing semiconductor device comprising the steps of:

(a) establishing at least one semiconductor die having at least integrated one photo-sensing area defined at a forward surface thereof for photo-electronically transducing light within a predetermined range of wavelengths;

(b) forming on said semiconductor die a plurality of solder bump pads to be electrically coupled to said photo-sensing area;

(c) attaching a plurality of first solder bumps respectively to said solder bump pads formed on said semiconductor die;

(d) establishing at least one unit substrate formed of a material substantially transparent to light within said predetermined range of wavelengths;

(e) applying at least a first metal layer on said unit substrate about a front surface region thereof;

(f) selectively removing portions of said first metal layer to define a plurality of first and second solder bump pads and a plurality of interconnection lines each extending between at least one first solder bump pad and at least one said second solder bump pad;

(g) forming at least one passivation layer to extend over said first metal layer;

(h) selectively removing portions of said passivation layer to define a plurality of first and second access openings aligned respectively with said first and second solder bump pads;

(i) placing said semiconductor die in inverted manner over said unit substrate, said first solder bumps each engaging one said first access opening of said passivation layer to contact one said first solder bump pad, said photo-sensing area of said semiconductor die being thereby guided into alignment with said front surface region of said unit substrate; and, (j) heating said first solder bumps to a characteristic reflow temperature thereof for attachment to said first solder bump pads of said unit substrate.

10. The method of packaging a photo-sensing semiconductor device as recited in claim 9 further comprising the step of attaching a plurality of second solder bumps respectively to said second solder bump pads through said second access openings.

11. The method of packaging a photo-sensing semiconductor device as recited in claim 9 further comprising after step (h) the steps of applying a dust-sealing material over at least a portion of said passivation layer; and, selectively removing portions of said dust-sealing material to form a dust-seal layer about said front surface region of said unit substrate.

12. The method of packaging a photo-sensing semiconductor device as recited in claim 9 wherein a plurality of said unit substrates are integrally defined on a substrate, said substrate being diced after step (j) for separation of said unit substrates one from the other.

13. The method of packaging a photo-sensing semiconductor device as recited in claim 9 wherein a plurality of said semiconductor dice are integrally defined on a wafer, said wafer being diced before step (i) for separation of said semiconductor dice one from the other.

14. The method of packaging a photo-sensing semiconductor device as recited in claim 13 wherein a pick-and-flip-and-place operation is sequentially executed to place said semiconductor dice respectively over corresponding ones of said unit substrates.

15. The method of packaging a photo-sensing semiconductor device as recited in claim 9 further comprising before steps (c) and (i) the steps of applying a solder flux material respectively to said solder bump pads of said semiconductor die and said first solder bump pads of said unit substrate.

16. The method of packaging a photo-sensing semiconductor device as recited in claim 9 further comprising the step of forming a second metal layer at least partially on said passivation layer, said second metal layer being patterned to extend at least partially over said first and second access openings to contact said first and second solder bump pads.

* * * * *